US005744960A

United States Patent [19]
Pulyer

[11] Patent Number: 5,744,960
[45] Date of Patent: Apr. 28, 1998

[54] PLANAR OPEN MAGNET MRI SYSTEM

[75] Inventor: Yuly M. Pulyer, Revere, Mass.

[73] Assignee: Brigham and Women's Hospital, Boston, Mass.

[21] Appl. No.: 695,174

[22] Filed: Aug. 8, 1996

[51] Int. Cl.$^6$ .................................................. G01V 3/00
[52] U.S. Cl. ........................................ 324/320; 324/319
[58] Field of Search ................................. 324/300, 303, 324/307, 309, 311, 312, 318, 322; 128/653.5; 335/296, 299

[56] References Cited

U.S. PATENT DOCUMENTS

| | | | |
|---|---|---|---|
| 4,379,262 | 4/1983 | Young | 324/309 |
| 4,590,427 | 5/1986 | Fukushima et al. | 324/311 |
| 5,117,188 | 5/1992 | Ohkawa | 335/296 |
| 5,402,094 | 3/1995 | Enge | 128/653.5 |
| 5,428,292 | 6/1995 | Dorri et al. | 324/319 |

*Primary Examiner*—Louis M. Arana
*Attorney, Agent, or Firm*—George W. Neuner

[57] ABSTRACT

A magnet resonance imaging system is described having an open magnet structure that provides a remote region of background field homogeneity for imaging. The system includes spatial encoding gradient coils and an rf coil. The open magnet structure has a primary magnet with two primary pole pieces connected by a primary ferromagnetic core for internal flux. Each primary pole piece has a surface facing away from the primary magnet. Located between the two primary pole pieces is a bias magnet having two bias pole pieces connected by a bias ferromagnetic flux pathway for internal flux. The bias magnet has polarity opposite to the primary magnet. Each bias pole piece has a surface facing away from the bias magnet and in a direction the same as the surfaces of the primary pole pieces. Superposition of the magnetic fields of the primary magnet and bias magnet provide a region of substantial background field homogeneity remote from the magnets in said direction. Also described are (i) planar spatial encoding gradient coils that provide a remote gradient field in the region of substantial background field homogeneity and (ii) a planar rf coil that provides a remote rf field in the region of substantial background field homogeneity.

18 Claims, 13 Drawing Sheets

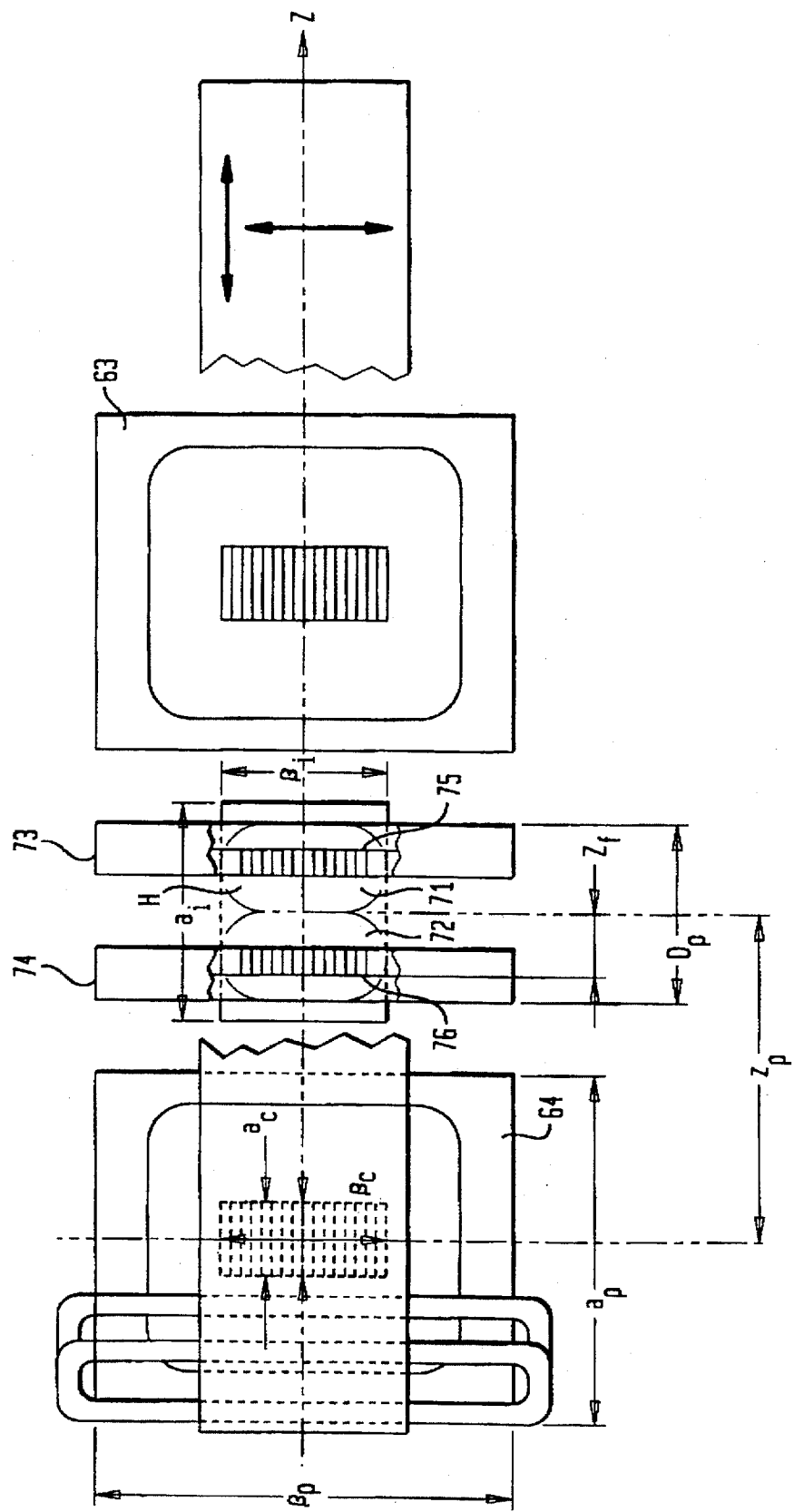

PLANAR OPEN MAGNET MRI SYSTEM

FIELD OF THE INVENTION

This invention relates magnetic resonance imaging (MRI) systems, to magnet systems for producing a homogeneous imaging field for MRI and, particularly, to open magnet systems for providing a remote region of field homogeneity along with planar gradient coils for delivering gradient fields for spatial encoding in a remote target field region.

BACKGROUND OF THE INVENTION

There are known whole body MRI magnets (superconductive, permanent magnets and resistive magnets), which produce the background $B_o$ field used in MRI. The useable imaging volume in these magnets is in the region where the field homogeneity is a maximum. This volume is located in the air space centrally located between field sources. Thus, typically, MRI magnets are designed to provide a homogeneous magnetic field in an internal region within the magnet, e.g., in the air space of a large central bore of a solenoid or in the air gap between the magnetic pole plates of a C-type magnet. A patient or object to be imaged is positioned in the homogeneous field region located in such air space. In addition to the main or primary magnet that provides the background magnetic field $B_o$, the MRI system typically has gradient and rf coils which are used respectively for spatial encoding and exciting/detecting the nuclei for imaging. These gradient field and rf coils are typically located external to the patient inside the geometry of the $B_o$ magnet surrounding the central air space.

Prior art electromagnets such as described by Watson et al and Müller et al. and other prior art iron core magnets typically have a structural design to provide a high strength magnetic field at a large central air space. In addition, those types of the prior art magnets, of the iron core electro- or permanent type, have a substantial edge fringe field effect, which makes it difficult to image beginning immediately at the magnet edge or even proximal to the edge of the magnet due to lack of sufficient field homogeneity.

In U.S. Pat. No. 5,049,848 a magnet configuration for MRI mammography is disclosed. The magnetic structure 50 has a rectangular shaped magnet with at least two parallel magnetic source 5, 6 connected by a ferromagnetic core flux path defining an air gap for imaging. A remote shimming C-shaped magnetic source is preferably used for shimming to decrease the front edge fringe effect of the magnetic structure 50 to create a relatively homogeneous field in the air gap beginning at the front edge for effective imaging.

Solenoidal MRI magnets (superconductive, resistive) as well as iron core C and E shape electromagnets or permanent magnets are known for imaging of the whole body and its extremities. However, such whole body MRI magnets are not generally well-suited for treatment of the patient with other modalities or for minimally invasive surgical procedures guided by real time MRI because of the limited access of the surgeon to the patient. This limited access results from the field producing means surrounding the imaging volume. Electromagnets of the C or E type iron core configuration have been designed to offer a partially open access to the patient, however, the access is still very limited with typical air gaps of only 40 cm between the pole pieces of a C type magnet. Another type of magnet specifically designed for interventional surgical guidance is General Electric's Magnetic Resonance Therapy device, which consists of two superconducting coils in a Helmholtz coil type arrangement. The air gap for this magnet is 58 cm, which typically permits access by one surgeon. None of those prior art magnets or MRI systems are not ideal with regard to simultaneously offering real time imaging and fully open access to the patient. Many surgical procedures require three or more surgeons together with an array of supporting equipment and, thus, a fully open magnet configuration for a MRI system for interventional procedures is desirable.

Applications other than MRI have used magnets that produce a useful field region outside the magnet geometry. U.S. Pat. No. 4,350,955 describes means for producing a cylindrically symmetric annular volume of a homogeneous magnetic field remote from the source of the field. Two equal field sources are arranged axially so that the axial components of the fields from the two sources are opposed, producing a region near and in the plane perpendicular to the axis and midway between the sources where the radial component of the field goes through a maximum. A region of relative homogeneity of the radial component of the background field $B_r$ may be found near the maximum. The large radial field is generally denoted as the $B_o$ background field in MRI applications. See also, *J. Mag. Resonance* 1980, 41:400–5; *J. Mag. Resonance* 1980, 41:406–10; *J. Mag. Resonance* 1980, 41:411–21. Thus, two coils producing magnetic dipole fields having opposing direction are positioned axially in a spaced relationship to produce a relatively homogeneous toroidal magnet field region in a plane between the magnets and perpendicular to the axis of cylindrical symmetry. This technology has been used to provide spectroscopic information for oil well logging but has not been used for imaging.

Copending U.S. application Ser. No. 08/515,483 describes a magnetic resonance imaging (MRI) probe having an external background magnetic field $B_o$. The probe has a primary magnet having a longitudinal axis and an external surface extending in the axial direction and a rf coil surrounding and proximal to the surface. The magnet provides a longitudinal axially directed field component $B_z$ having an external region of substantial homogeneity proximal to the surface. Comparing this magnet geometry to that of U.S. Pat. No. 4,350,955, it has a background $B_o$ field with a cylindrically symmetrical region of homogeneity. However, this magnet described in the copending application provides such a field in the axial or z direction (i.e., longitudinal axis direction) whereas the other provides a background $B_o$ field in the radial or r direction (i.e., radial direction). Preferably, the $B_o$ field is provided by two magnets spaced axially and in axial alignment in the same orientation and wherein said region of homogeneity intersects a plane that is located between the magnets and that is perpendicular to the axis. For MR imaging, surrounding the primary magnet are r-, z- and φ- gradient coils to provide spatial encoding fields.

It is desirable to have new and better devices and techniques for biomedical MRI applications such as open magnet MRI systems for imaging while performing surgery or other treatments on patients. It is also desirable to have portable devices and imaging techniques that could be applied to a wide variety of imaging uses.

SUMMARY OF THE INVENTION

The present invention provides a planar MRI system having an open magnet configuration that produces a magnetic field having a substantial remote region of homogeneity. The magnet configuration comprises two pairs of planar pole pieces. The first pair of pole pieces is located centrally and the second pair of pole pieces is located peripherally and has opposing polarity to the first pair of pole pieces. The two pairs of pole pieces provide two external fields of opposite polarity such that the interference of the two fields produces a resulting remote field having a substantial region of homogeneity.

As used herein, the term "remote field" means that the field is located external to the magnet geometry producing the field. Typically, the magnet geometry will be located on one side of a planar surface and the patient or body component to be imaged will be located on the opposite side of the planar surface. As used herein, the terms "substantial homogeneity", "substantial field homogeneity" or "substantial relative field homogeneity" refer to and mean field homogeneity sufficient for producing MRI images.

The distance of the region of homogeneity from the surface of the pole pieces can be controlled by varying the ratio between the magnetomotive forces of the peripheral pair of pole pieces and the central pair of pole pieces. The peripheral pair of pole pieces provide the major field and determine the basic field strength. The central pair of pole pieces provide a biasing field. Thus, the relative strength of the basic field and the biasing field determines the distance of the region of homogeneity from the planar surface. The size of the homogeneous region can be influenced by the size, geometry, spacing and orientation angle of the pole pieces with respect to the planar surface.

The MRI system also has (i) a xyz planar gradient coil system that produces a constant gradient field for spatial encoding in the region of homogeneity, i.e., the imaging volume or target region, as well as (ii) rf excitation and receiving coil (either integral or separate rf coils). Shimming coils and/or passive ferromagnetic shimming can be provided to increase the remote field homogeneity in a particular region.

The size of the magnet configuration and MRI system in accord with the present invention can be varied to provide whole body imaging or portable systems for localized imaging.

BRIEF DESCRIPTION OF THE DRAWINGS

FIG. 8B is a plan view, partially in cross section, of the magnet configuration of FIG. 8A.

DETAILED DESCRIPTION OF THE INVENTION

Figure 1A:
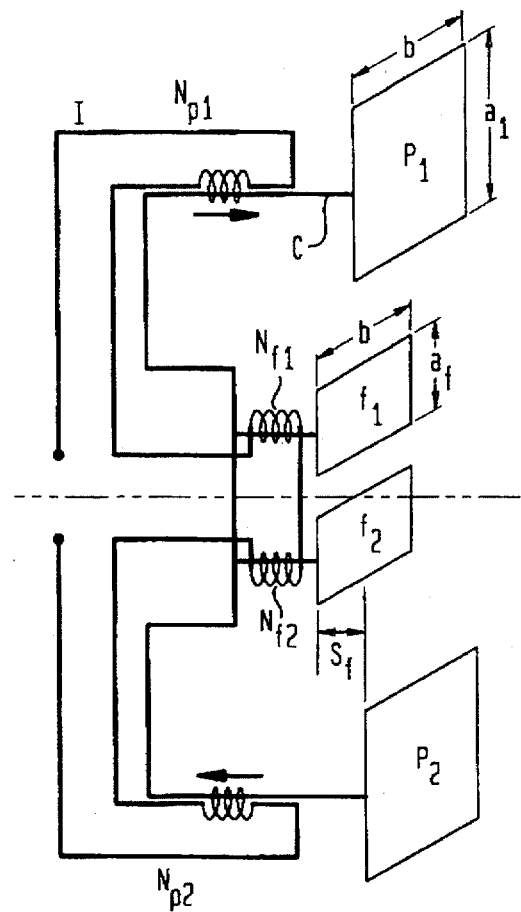
FIG. 1A is a schematic illustration of an electromagnet configuration in accord with the present invention.

The invention will be described with reference to the drawings wherein like reference numerals in different figures refer to the same component. In accord with the present invention, a magnet configuration for a MRI system is an open device that provides a background $B_o$ field having a remote region of substantial homogeneity. As illustrated in FIG. 1A, two pair of pole pieces are provided in an open configuration. A first pair of pole pieces $P_1$, $P_2$ provide the main background $B_o$ field as determined by the coils having turns $N_{p1}$, $N_{p2}$. A second pair of pole pieces $f_1$, $f_2$ provide a bias field, opposing the main background field, as determined by the coils having turns $N_{f1}$, $N_{f2}$.

Figure 1B:
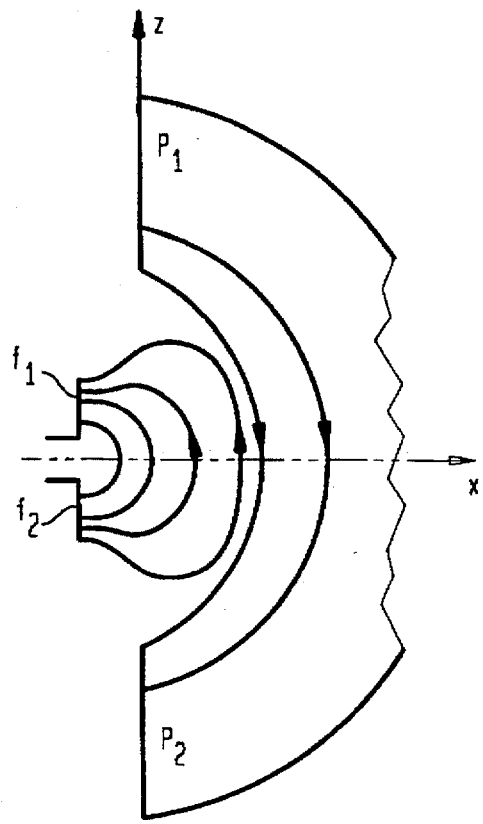
FIG. 1B is a schematic illustration of the field lines emitted by the magnet configuration of FIG. 1A.
Figure 1C:
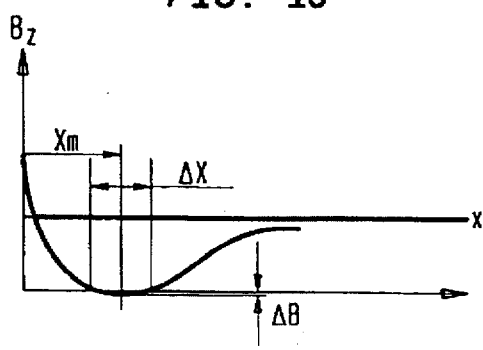
FIG. 1C is schematic illustrating the field $B_z$ plotted along the x-axis.

The first pair of pole pieces provide a first field flux $\Phi_1$ which generates the main background field $B_o$ and the second pole pair provides a second fringe flux $\Phi_2$ which generates the bias field. As illustrated in FIG. 1B, the two fluxes interfere with each other and provide a resulting additive field region illustrated in FIG. 1C, which shows a plot of $B_z$ versus x, the direction away from the magnets. This illustration shows the field going through an extremum at a value of x remote from the magnet pole pieces and thus defines a region of substantial relative field homogeneity $\Delta B_z$ over a distance $\Delta x$, i.e., where the $B_z$ field component is substantially homogeneous for MRI imaging to be performed.

The pole pieces are connected by a ferromagnetic core C, which is configured preferably to optimize the surface area of the main coil excitation sections for maximum heat dissipation as well as enhancing ease of manufacturing by use of traditional laminated core technology.

As illustrated in FIG. 1A, the ferromagnetic core can be common to both the first and second pairs of pole pieces. The central pole pieces $f_1$, $f_2$ of the bias field electromagnet and the two parallel ferromagnetic bars extending from the main ferromagnetic core to the central pole pieces together with a section of the ferromagnetic core form a C-shape electromagnet wherein the bars are coupled with excitation coils $N_{f1}$ and $N_{f2}$ connected in series with the two main coils to generate a central low power bias flux $\Phi_2$. Because the central electromagnet and the main or primary electromagnet share the central portion of the ferromagnetic core and provide opposing fluxes, the fluxes will subtract in the mutual core region. However, because the flux from the central magnet is much smaller than the primary flux and because the core material is preferably made of a material having a very high $\mu$, the small local field superposition will not have any practical effect on those two fluxes.

Figure 1D:
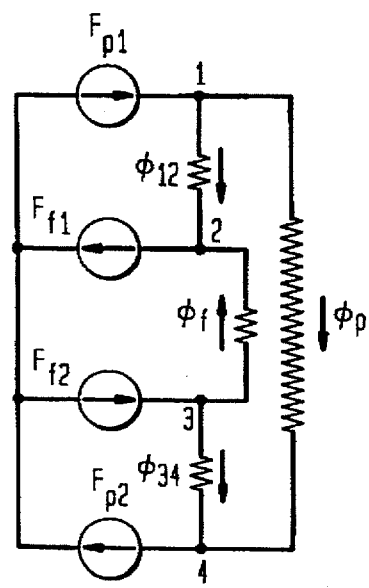
FIG. 1D is a schematic of an equivalent circuit of the magnet configuration illustrated in FIG. 1A.

An equivalent lumped parameter magnetic circuit for the magnet of FIG. 1A is provided in FIG. 1D to illustrate the basic relationship between the magnetomotive forces and fluxes and can be used as an aid in computation of an electromagnet to determine core dimensions, coil parameters for desired field strength, region of homogeneity, current density, core saturation induction, etc. This computation can be performed by conventional techniques well known to those skilled in the art by resolving the field problem based on given pole piece boundary conditions to determine reluctances in the equivalent circuit.

The position of the region of homogeneity is controlled by the ratio of magnetomotive forces as provided by the primary and central pole pieces. Advantageously, separate current sources can be provided for the primary coils and the central coils to have more control over the magnetomotive forces of the two different coil systems and thereby vary the distance from the magnets of region of substantial field homogeneity. The shape and geometry of the pole pieces are primary factors for defining the region of substantial homogeneity.

Figure 10:
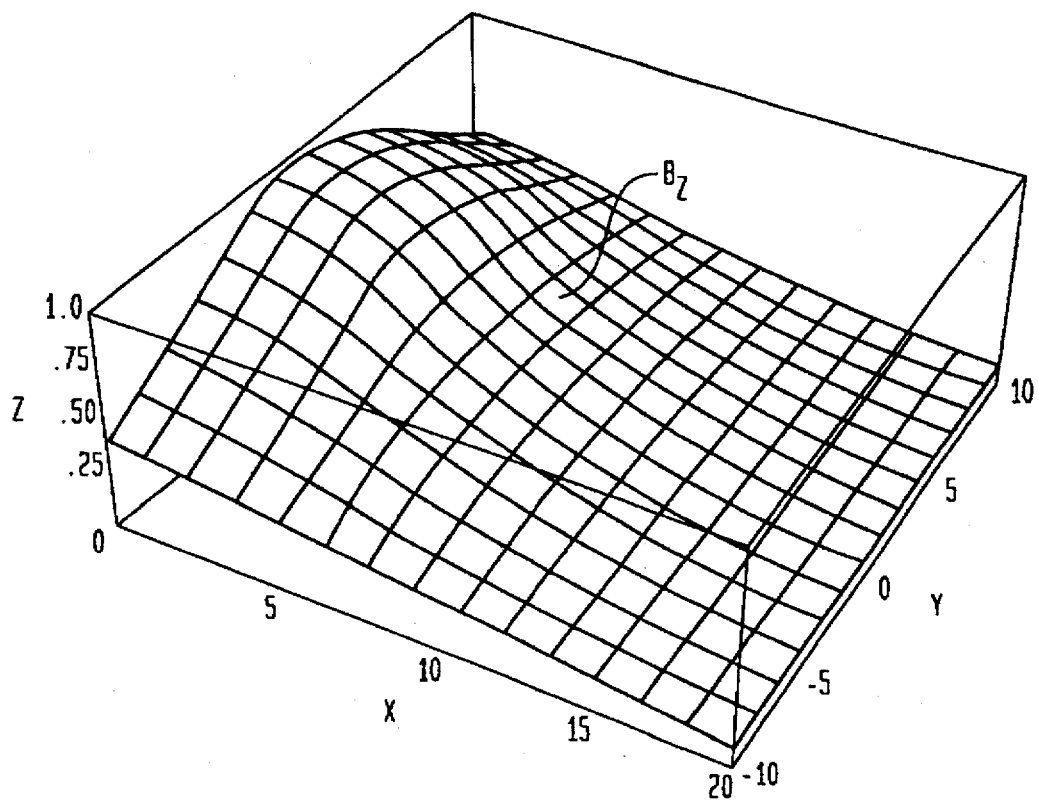
FIG. 10 is a plot of a remote region $B_z$ component field for a planar open magnet of the present invention.

The magnet core configuration illustrated in FIG. 1A is optional and can be varied in shape according to physiological requirements and the dimension of the target field region. FIG. 10 shows the result of computation of remote field provided by a magnet configuration in accord with the present invention and illustrates the relative homogeneity of the z component of the background $B_o$ field remote from the magnets.

In accord with the present invention, a MRI system comprising a magnet configuration as illustrated in FIG. 1A also comprises a set of xyz gradient coils to provide spatial encoding in the remote region of background $B_o$ field homogeneity for imaging. In keeping with the planar open design of the magnet geometry and configuration of the present invention, planar xyz gradient coils were created. Advantageously, the remote field xyz gradient coils are preferably planar open surface coils. Preferably, the entire gradient coil is substantially in the same plane. In accord with the present invention, each current plane coil does not have a complimentary or mirror image current plane in order to generate the desired gradient field between the complimentary planes. Thus, in accord with the present invention, each single planar gradient coil produces a remote gradient field along the x, y or z axis in the target region of background field homogeneity.

Figure 2:
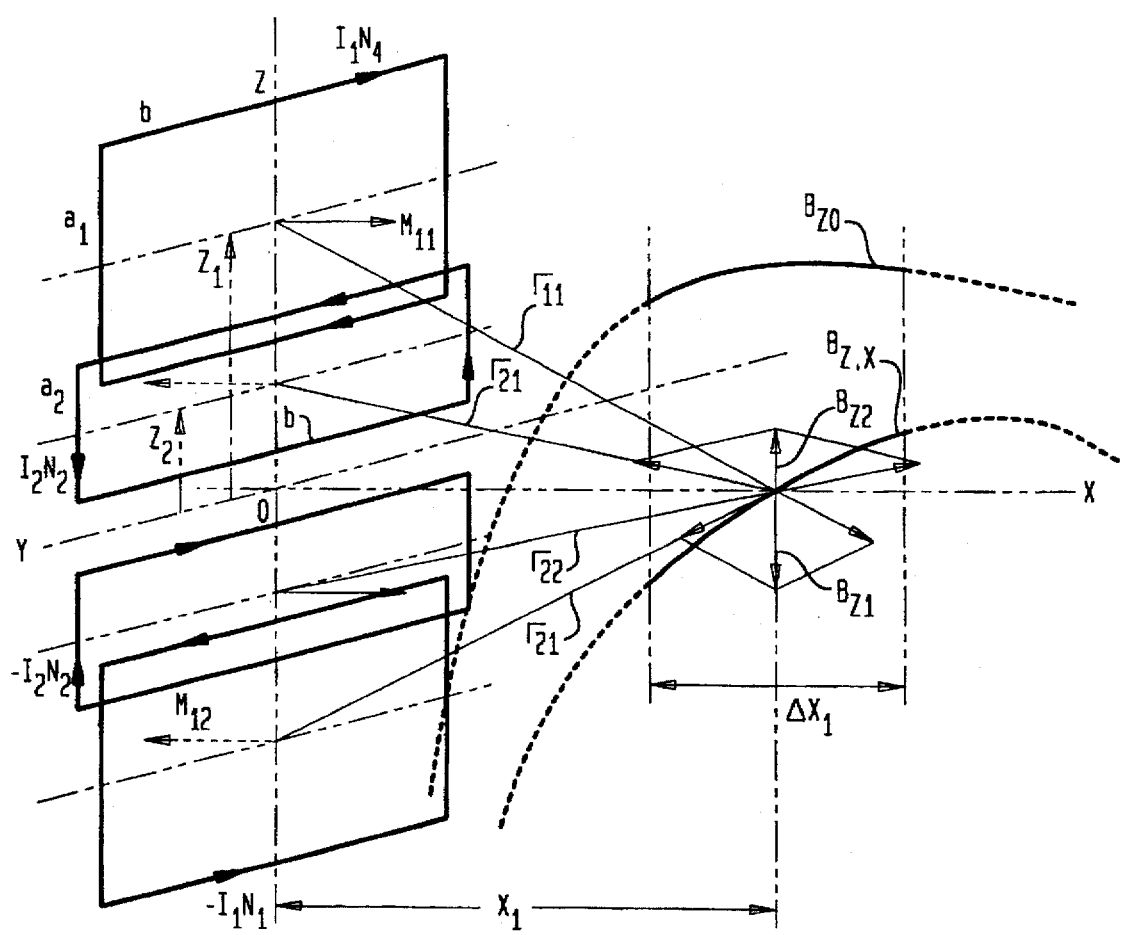
FIG. 2 is a schematic illustrating a planar remote field x-gradient coil in the form of an array of current loops and further illustrating at the center of each loop the vector magnetic dipole associated with the loop. Also illustrated are the field vectors generated by the magnet dipoles, which shows an approximately constant gradient field.

In accord with this invention, as illustrated in FIG. 2, a planar remote field x-gradient coil can be constructed using multiple current loops in a current loop array configuration. As shown, two external loop sections are configured to have mutually opposite current polarity. Two internal current loop sections are configured also to have mutually opposite current polarity and the current polarity in the inner loop sections is also mutually opposite its corresponding external loop section (FIG. 2a). The array loops are symmetric with respect to the y and z axes.

Also illustrated on the right side of FIG. 2 is a simple field computation approximation using the magnetic moment vectors associated with the current loops. The basic $B_z$ field components at $x_1$ contributed by each of the four magnetic dipoles are shown. The vector sum of the field from the two main current loops with current $I_1$ and turns $N_1$ is denoted $B_{z1}$ and the two bias current loops with current $I_2$ and turns $N_2$ is denoted $B_z$. Also illustrated on right hand side of FIG. 2 are (i) the vector sum of the field from the current loops which produces a gradient field $B_{z,x}$ which is substantially linear over the target field region $\Delta x_1$ and which corresponds to the region in which the background field $B_{z,o}$ (also shown) goes through an extremum.

Figure 3A:
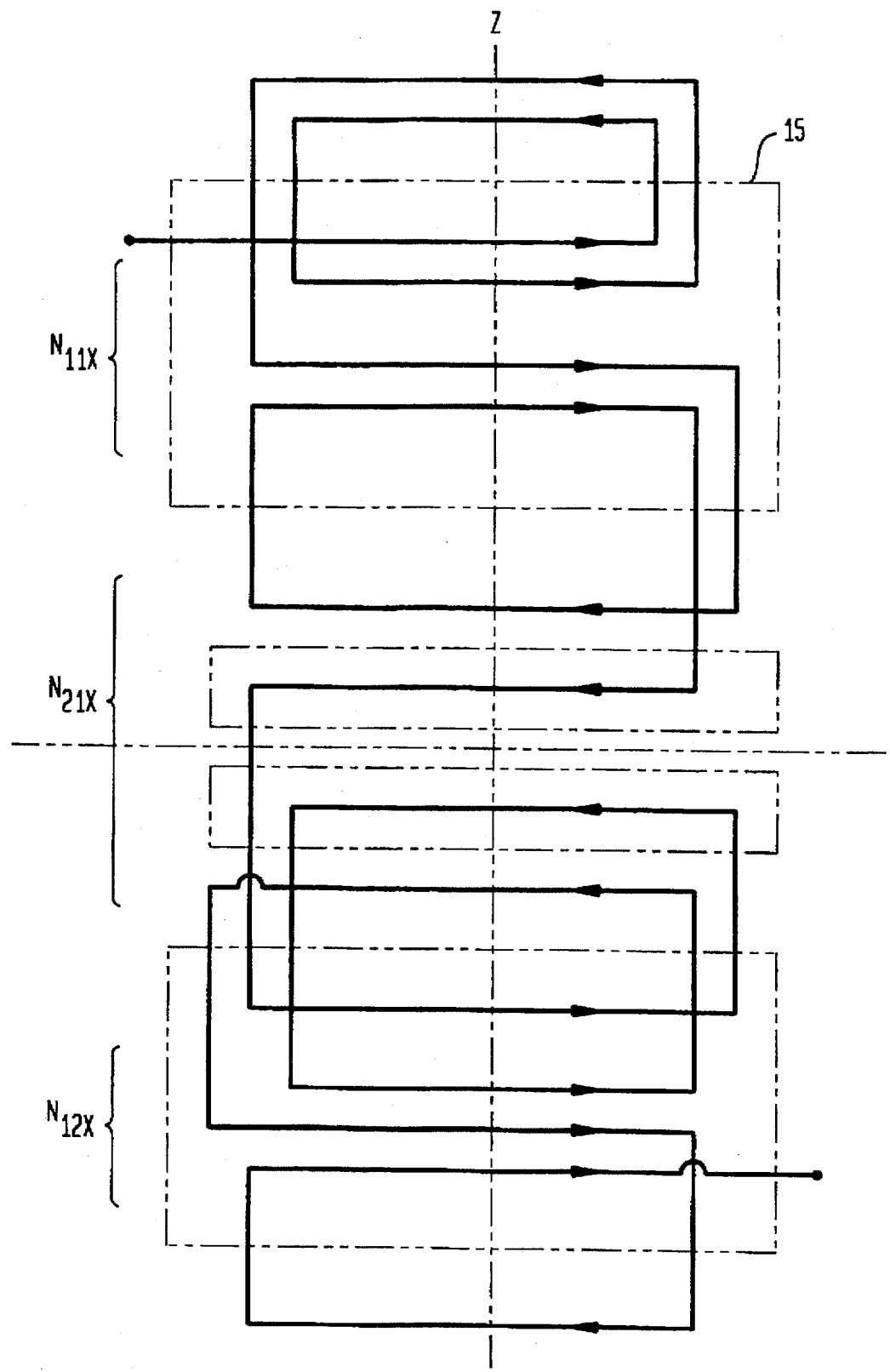
FIG. 3A is a schematic plan view illustration of a planar remote field x-gradient coil in the form of an array of current wires.
Figure 3B:
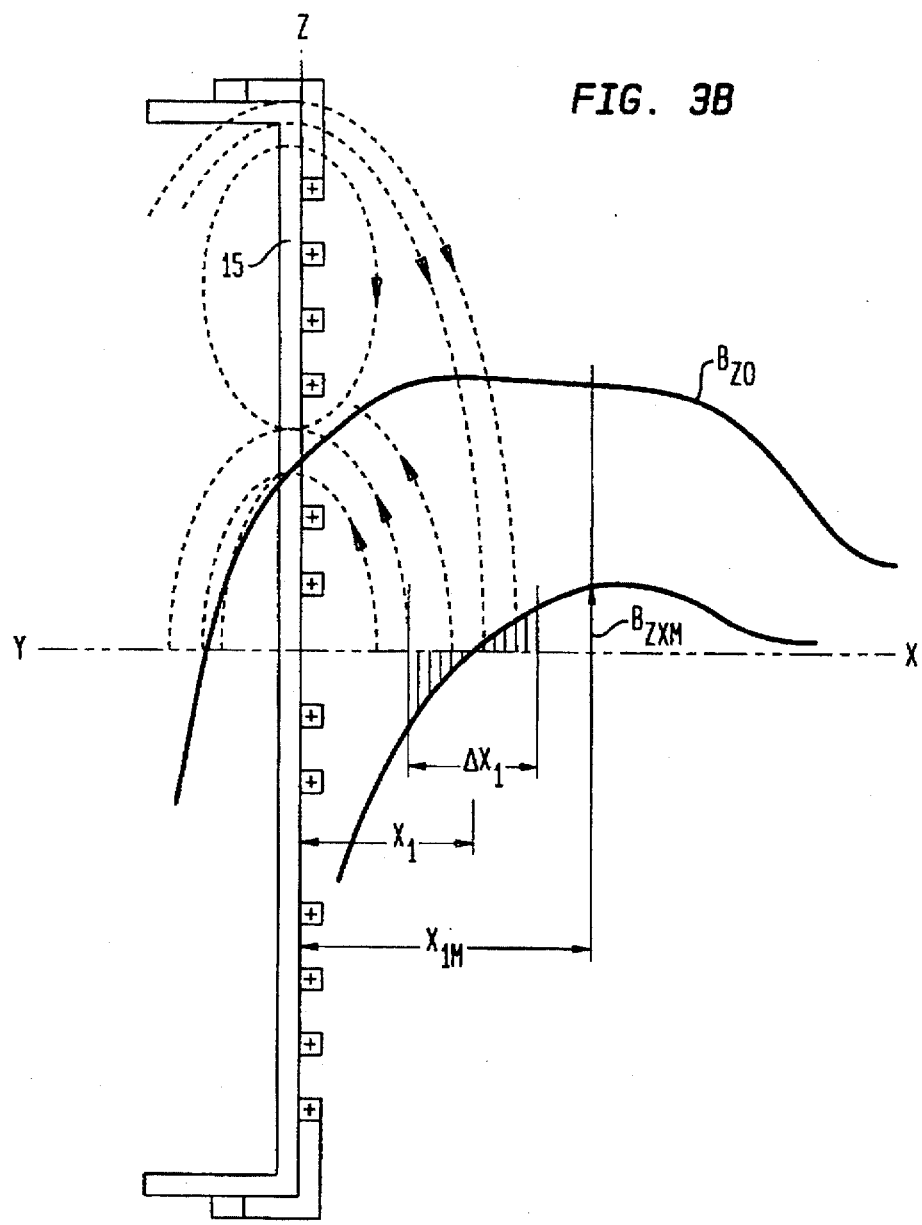
FIG. 3B is a cross sectional view of the x-gradient coil of FIG. 3A along the z-axis illustrating field lines and further schematically illustrating the $B_z$ field as a function of x at y=z=0 showing an approximately constant gradient field with respect to x.
Figure 3C:
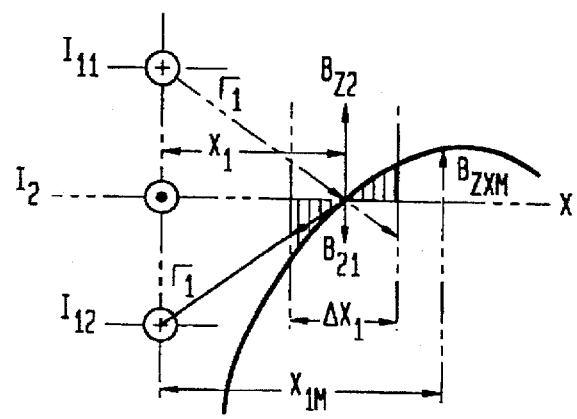
FIG. 3C illustrates a simple three current wire array and a simple computation vector diagram for this current wire array.

An alternative x-gradient coil structure is illustrated in FIG. 3A, with field lines of the two opposing fluxes illustrated in FIG. 3B with the resultant x-gradient field, z component, $B_{z,x}$ which is substantially linear over $\Delta x_1$ illustrated in the right side of FIG. 3B. This coil structure is a current wire array and will provide a remote linear x-gradient field similar to the current loop array depicted in FIG. 2. FIG. 3C illustrates a simple three wire system for demonstration purposes.

The x-gradient coil structure has ampere wire distribution on a planar surface 15 with two external unidirectional current wire sections $N_{11x}$ and $N_{12x}$. With a central unidirectional current section $N_{21x}$ having opposite current polarity to provide a central bias field, thereby providing a remote z-component field having substantially constant gradient as illustrated in FIG. 3B.

It should be noted that the x-gradient coil geometry is similar in concept to the magnet geometry for the $B_o$ background field.

Figure 4A:
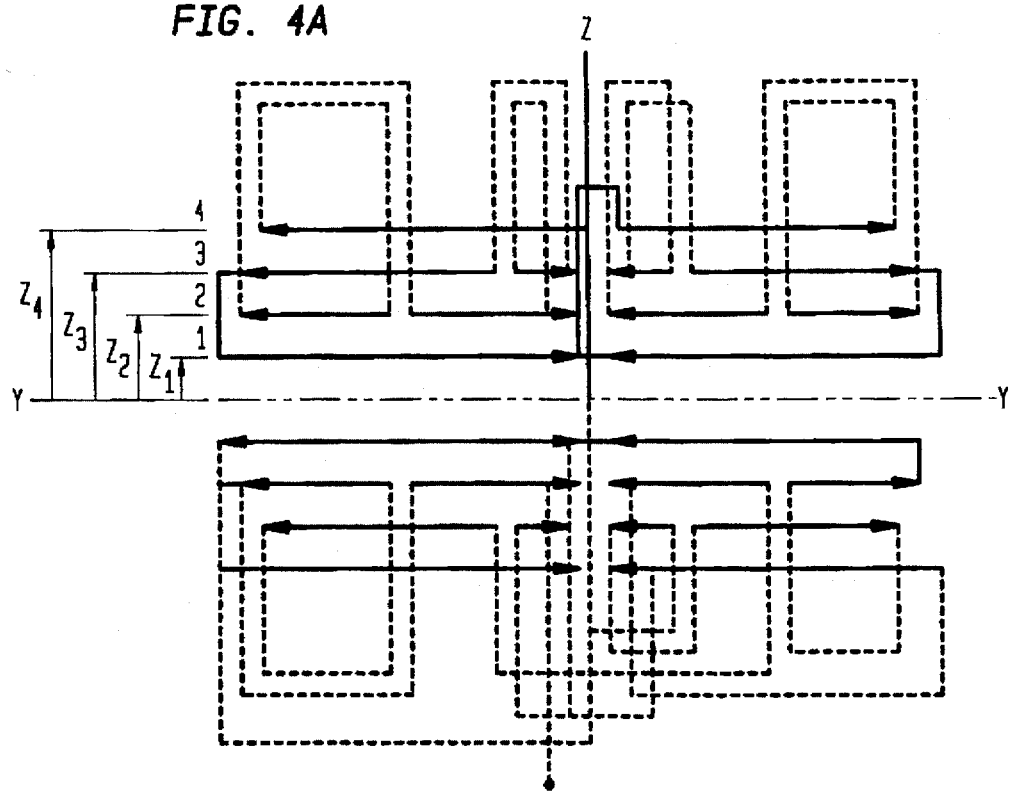
FIG. 4A is a schematic plan view illustration of a planar remote field y-gradient coil in the form of a current wire array.

In accord with this invention, as illustrated in FIG. 4A, a planar remote field y-gradient coil can be constructed using a current wire array. As illustrated, the current wire array preferably has four sections corresponding to four y, z quadrants: first having coordinates 0, -y, z; the second having coordinates o, y, z; the third having coordinates 0, -y, -z; and the fourth having coordinates 0, y, -z; in other words, the quadrant boundaries are the y and z axes in the x=0 plane. Each quadrant section is divided in subsections along the y axis. The subsections at each z-level ($Z_1$, $Z_2$, $Z_3$ . . . ) are symmetrical about and have opposing current polarity with respect to the z-axis. The subsections are also symmetrical about and have the same current polarity with respect to the y-axis. As can be seen from FIG. 4B, the number of current wires remains constant over y at each level of z, however, the number of wires having positive and negative current polarity varies along y. The current wires providing the remote y-gradient field are connected by return wires (dashed in FIG. 4A) which are located far enough away from the desired wire current array to minimize target field disturbance.

Figure 4B:
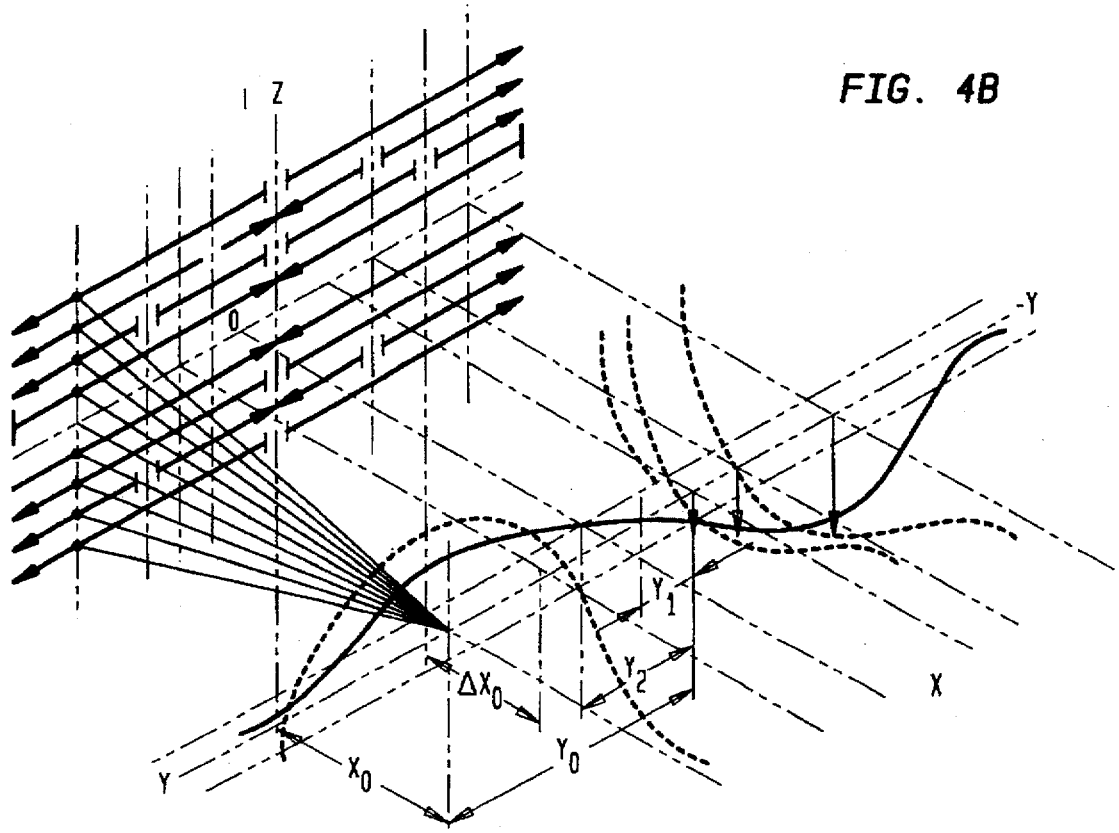
FIG. 4B is an isometric illustration of the planar array of FIG. 4A. including an illustration of the remote y-gradient field provided by the array of FIG. 4A.

FIG. 4B illustrates the current wire array, which is located in the x=0 plane, extends in the y direction from $+y_o$ to $-y_o$, and provides a y-gradient field in a remote region. It illustrates only the operative current wires of the array of the wiring schematic of FIG. 4A. The y-gradient field is a field directed in the same direction z as the background field $B_o$ and which varies linearly with y. On the right side of FIG. 4B is an illustration of the y-gradient field at the remote plane $x=x_o$. Note that the field is sinusoidal as a function of y so that the region of linearity is localized around y=0. The region of linearity can be specified as a fraction of $y_o$ which is approximately $0.5 y_o$. Thus, the region of linearity in y can be increased by increasing the spatial extent of the current wire array in y.

The gradient field depends upon y because the distribution of current wires with the y axis changetive currents parallel to the y axis changes with the y position. FIG. 4B illustrates the current pattern changes at $y=y_1$, $Y_2$, etc. Thus, between $Y_o$ and $y_1$, the current pattern as a function of z is constant and then changes to a different pattern between $y_1$ and $Y_2$. The field produced by each of these current patterns is shown as a function of x at each incremental y position where the z pattern of the current wire array changes. In each case, the field goes through an extremum at the same value of x, in this case $x_0$, however, the amplitude of the extremum changes from positive to negative producing the gradient field.

Figure 4C:
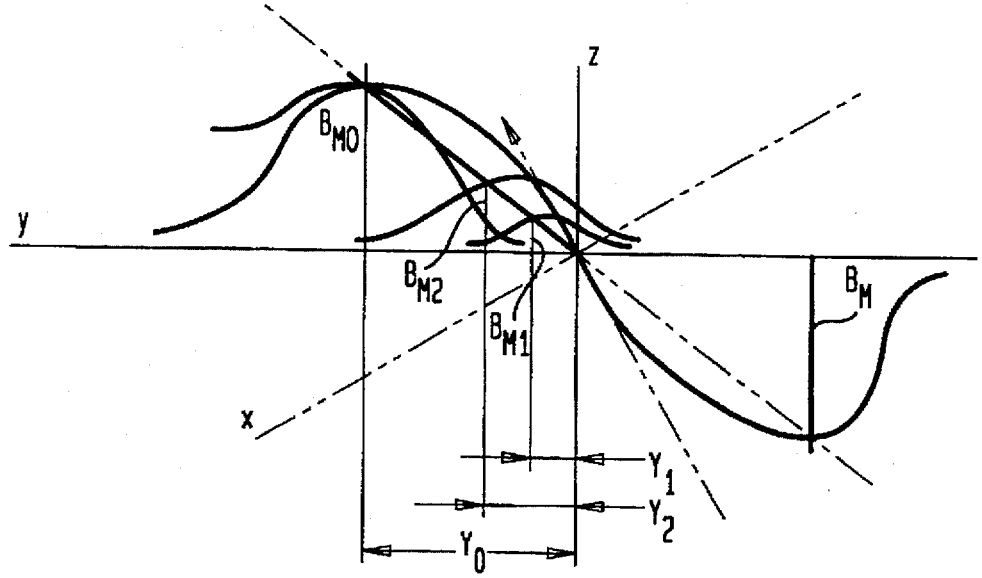
FIG. 4C is an illustration of the y-gradient field profile along the y-axis of FIG. 4B.

FIG. 4C is an illustration of the gradient field profile. Because the field is an extremum at the remote $x=x_o$ plane, it is a region of relative homogeneity. The region of homogeneity of the gradient field extends in the x direction over a distance $\Delta x_o$.

Figure 4D:
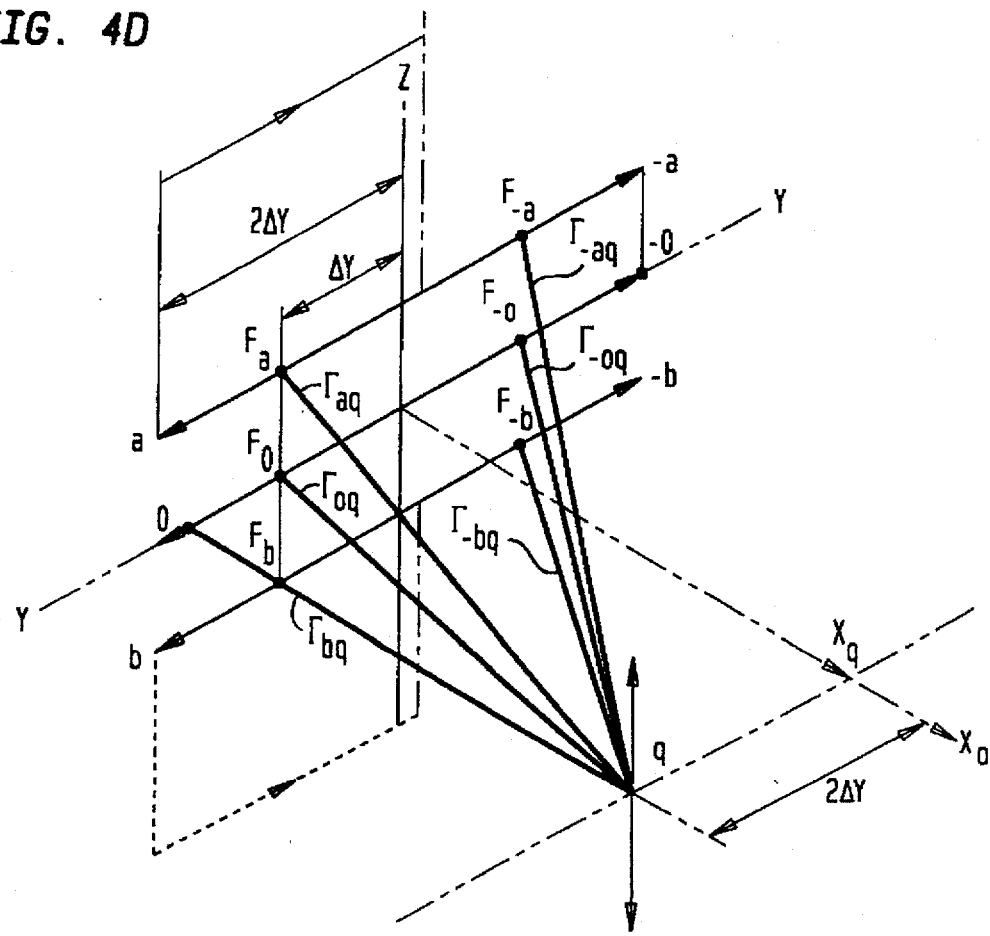
FIG. 4D is an illustration showing a simple six (6) wire array for a y-gradient coil for analysis of coil capability.

FIG. 4D illustrates the simplest six current wire array which is useful as an analytical model for easy computation of the remote y-gradient field.

Figure 5A:
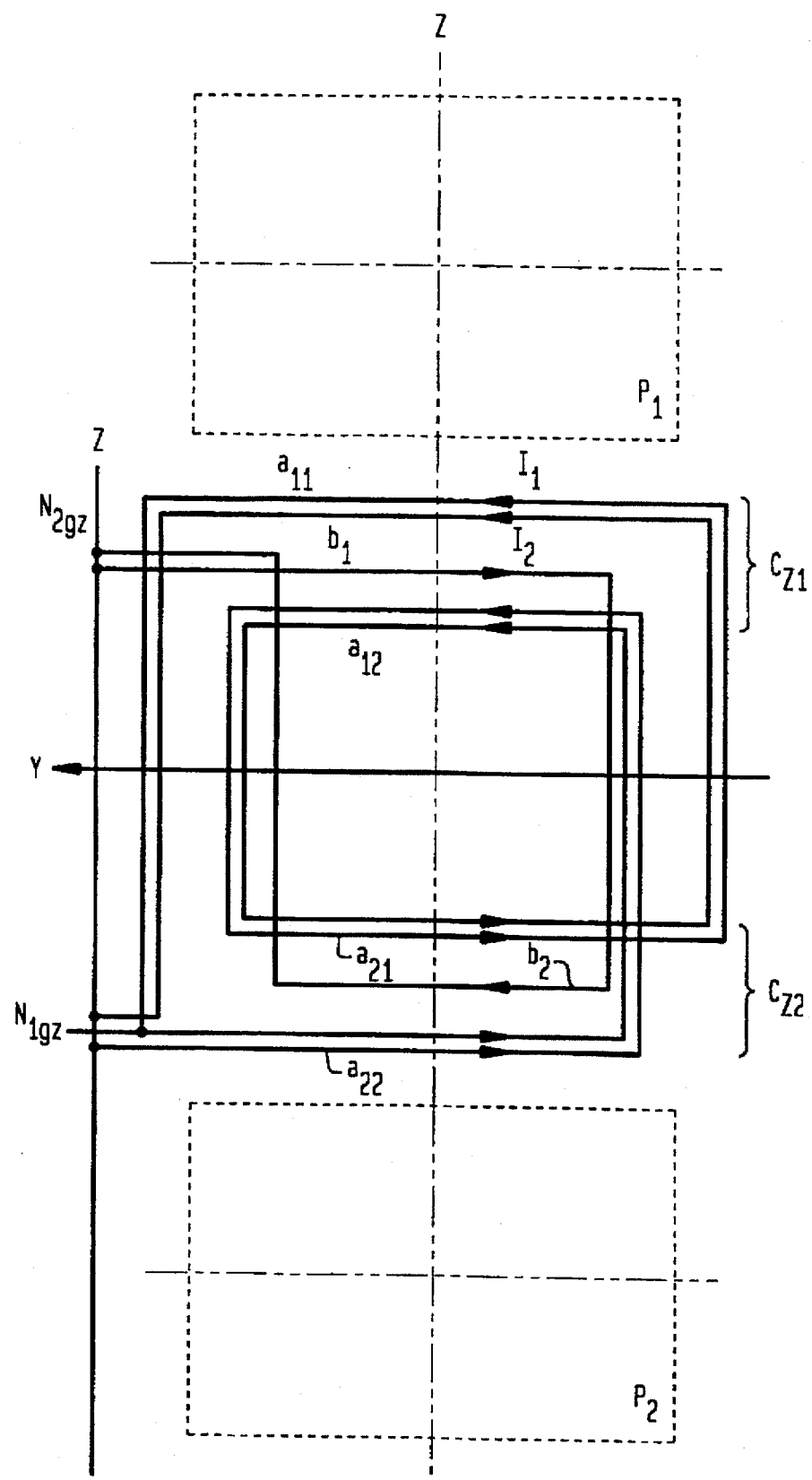
FIG. 5A is a schematic plan view illustration of a planar remote field z-gradient coil in the form of a rectangular loop array.

In accord with this invention, a planar remote field z-gradient coil can be constructed between the pole pieces $P_1$, $P_2$ of the primary magnet as illustrated by the wiring diagram in FIG. 5A. FIG. 5A shows a set of current wires $a_{11}$, $b_1$ and $a_{12}$ at positive values of z and a symmetric set of opposite polarity current wires $a_{22}$, $b_2$ and $a_{21}$ located at corresponding negative values of z. The current in wires $a_{11}$, $a_{12}$ have current in one direction with the bias wire set $b_1$ having current in the opposite direction. The wire sets $a_{21}$, $a_{22}$ and $b_2$ on the opposite side of the y-axis have currents flowing in the opposite directions to the currents in the corresponding wire sets $a_{11}$, $a_{12}$ and $b_1$. A remote z-gradient field is provided in the target background field. All of the current wires in sets "a" are preferably connected, as illustrated, to be supplied by a single power source. Similar to the field produced by the y-gradient coil of FIG. 4A, these two sets of current wires produce a field maximum, each of opposite sign at the remote plane $x=x_o$ at different values of z. This produces the gradient field illustrated in FIG. 5B.

Figure 5B:
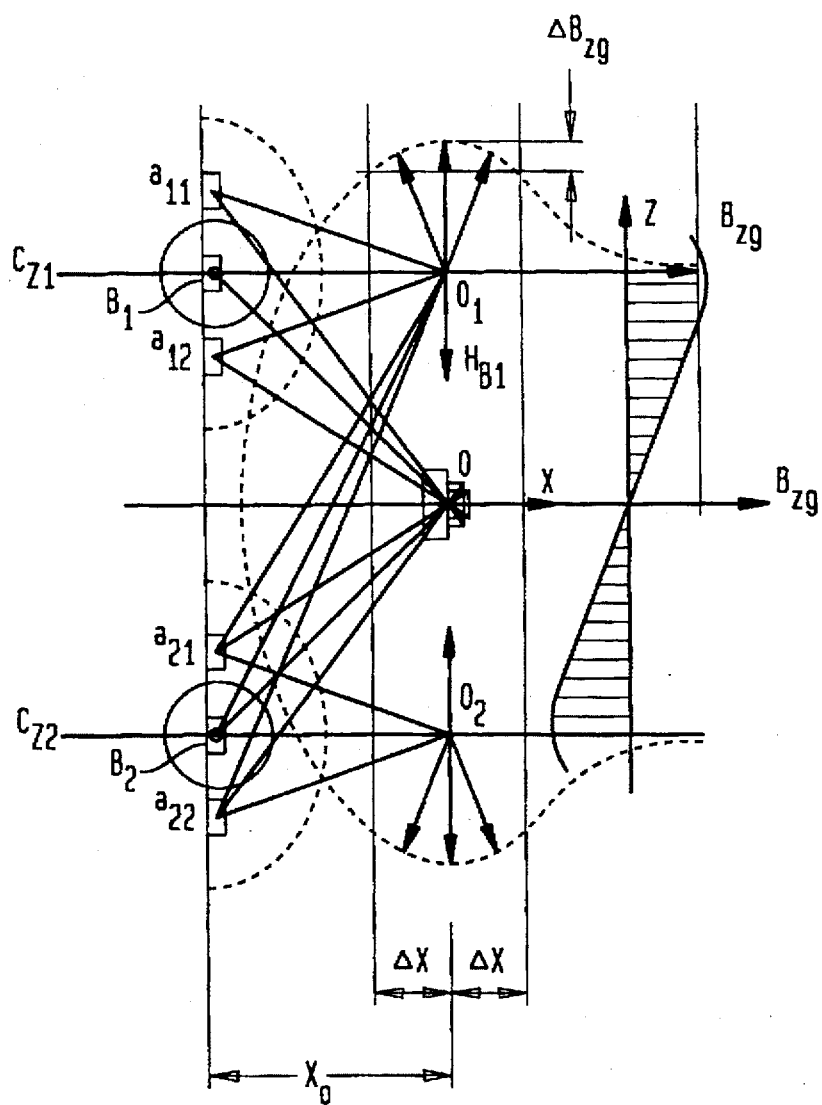
FIG. 5B is a schematic cross sectional view in the xz plane of the wires of the loop array of FIG. 5A and illustrates the remote z-gradient field provided by the z-gradient coil.

FIG. 5B shows a side cross sectional view of the z-gradient coil illustrating field line orientation in the xz plane at y=0 of the wire sets illustrated in FIG. 5A with a plot of the z component of the z-gradient field $B_{zg}$, illustrating a substantially constant gradient over a range of z.

Figure 6A:
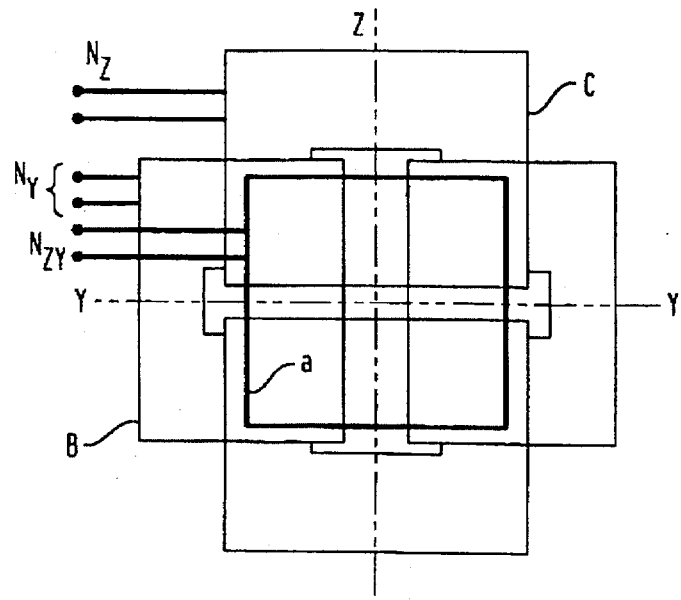
FIG. 6A is a schematic illustration of three rf coils for excitation and detection of the nuclear magnetic resonance signal, which provide a remote x-directional rf field orthogonal to the z directional background field.
Figure 6B:
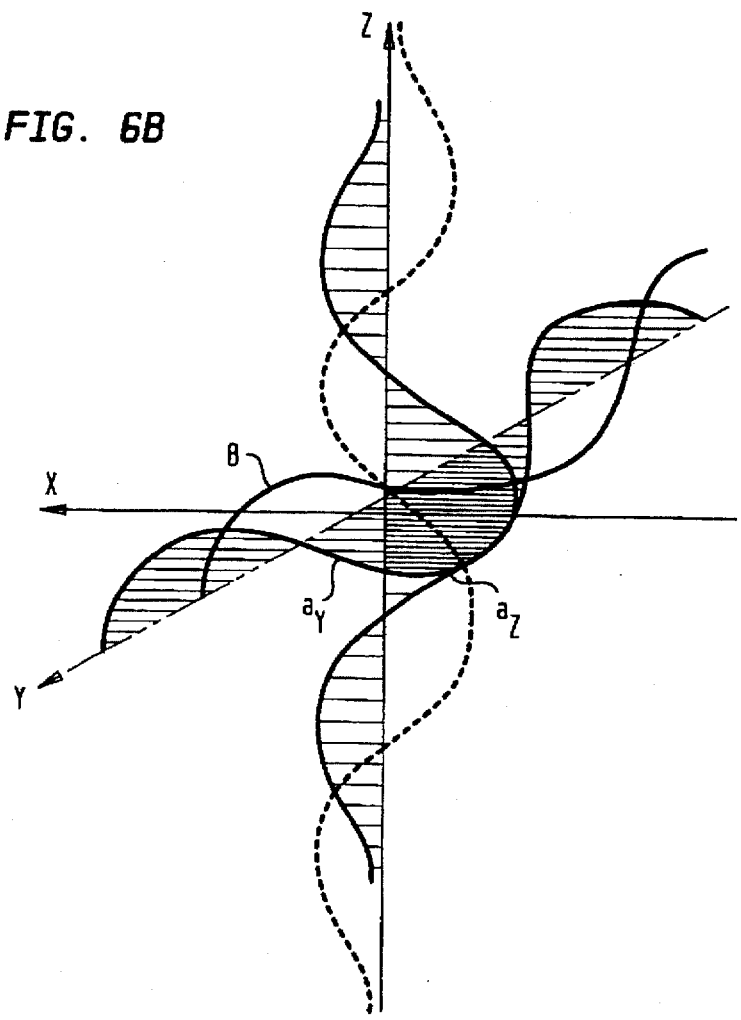
FIG. 6B illustrates the x-directional field provided by the rf coil of FIG. 6A which is orthogonal to the z-axis.

As illustrated in FIG. 6A, the present invention also provides a planar rf coil set, which provides a remote region of approximate rf field homogeneity wherein the major components are oriented orthogonal to the z component of the background field, i.e., oriented in the x-direction. The three coils illustrated can be used singly or in combination with each other to produce an rf field perpendicular to the $B_o$ field in different regions of the target volume. By varying the number of coaxial current loops in the rf coils, which can be in different but parallel planes, the region of the x-oriented rf field homogeneity can be positioned in the region of remote field homogeneity of the background field. FIG. 6B illustrates the x-directional field provided by the rf coil of FIG. 6A which is orthogonal to the z-axis. However, it will be appreciated by those skilled in the art that the rf field must be perpendicular to the $B_o$ field (which for discussion in this specification is in the z direction). Thus, an rf field in the y direction can also be illustrated in a similar manner and provided used for excitation and detection of the nuclear magnetic resonance signal.

Figure 7:
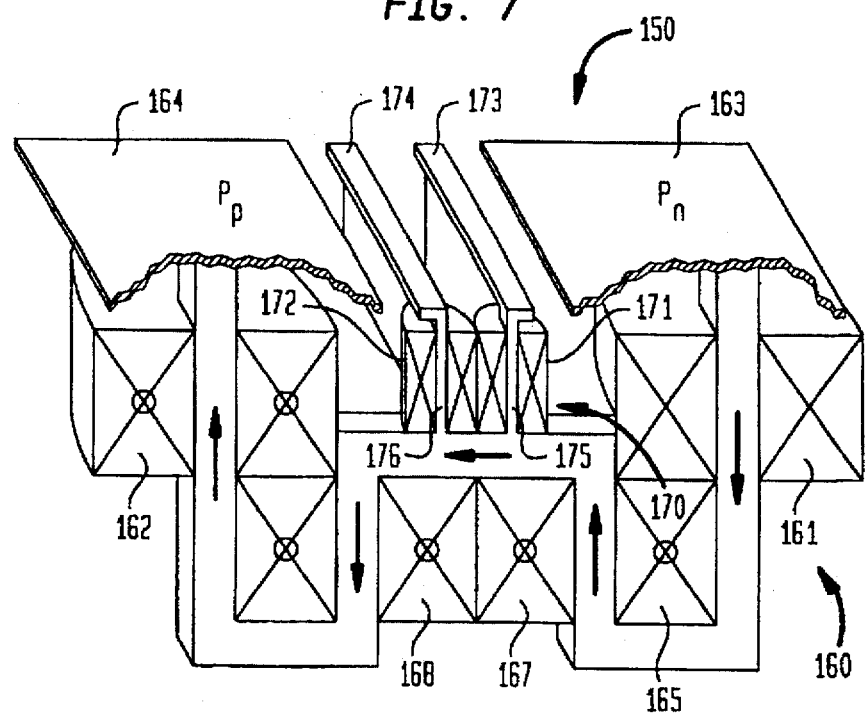
FIG. 7 is an isometric view, partially broken away, of an embodiment of an open magnet configuration for an MRI system in accord with the present invention.

FIG. 7 illustrates another embodiment of an open planar magnet configuration constructed in accord with the present invention. In this embodiment, the MRI magnet 150 has a primary electromagnet 160 with a ferromagnetic core 165 that was configured to accept four coils 161, 162, 167, 168 and two pole pieces 163, 164. The two pole pieces 163, 164 are essentially in the same plane. Centered between the pole pieces of the primary electromagnet is a bias electromagnet 170 that has two coils 171, 172 and two pole pieces 173, 174. The symmetrical magnet configuration provides a region of substantial homogeneity of the background field, also known as the imaging volume or the target region. The ferromagnetic core 65 provides an internal flux path for the primary electromagnet. Vertical ferromagnetic bars 175, 176 with the central portion of the core 165 provide an internal flux path for the bias electromagnet.

Figure 8A:
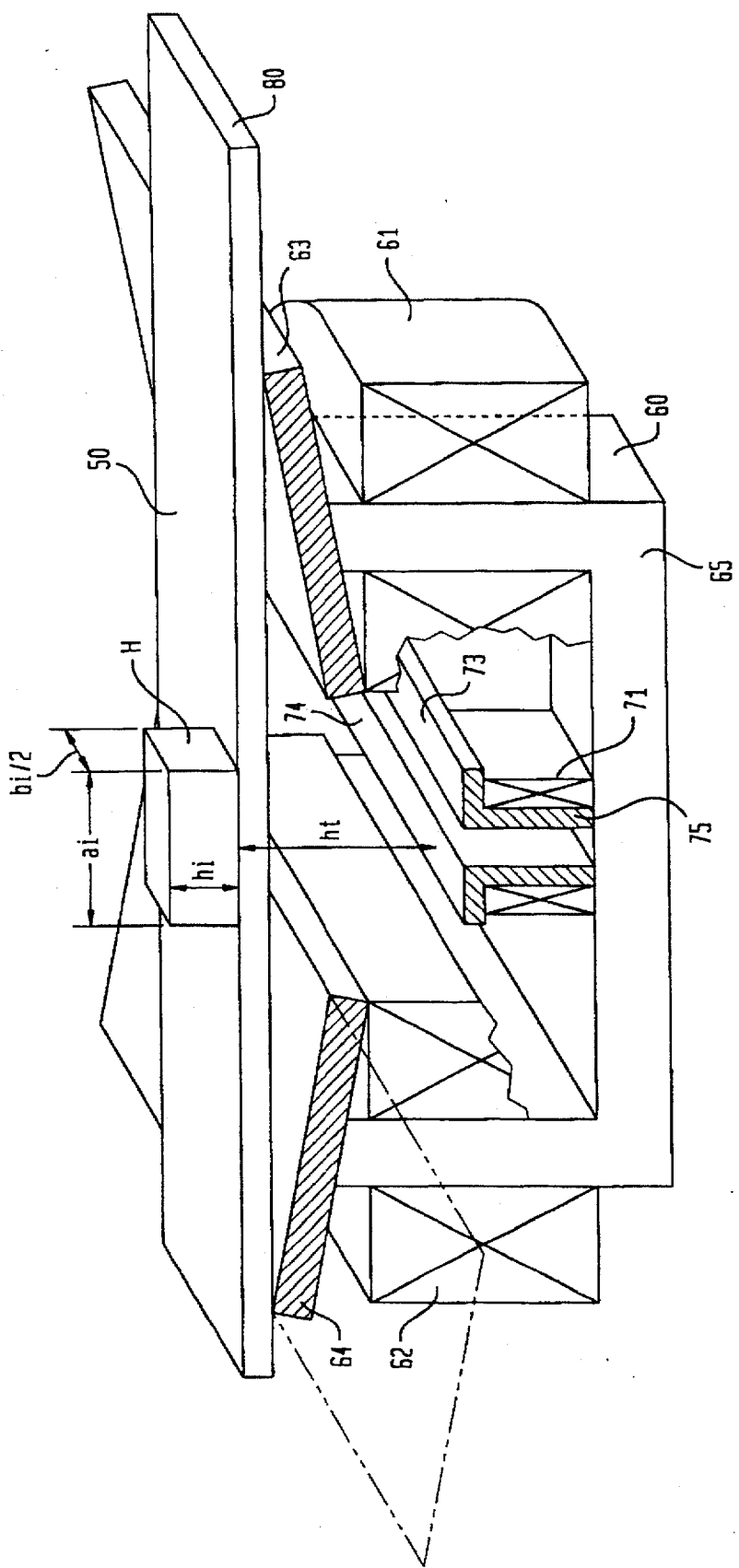
FIG. 8A is a perspective view, partially broken away, of an alternative whole body open magnet configuration for an MRI system in accord with the present invention wherein the background magnetic field provided by the magnet is parallel to the long axis of a patient table.

The open magnet configuration providing a remote background field for MRI can be made in any size to provide whole body capability or a portable system for more localized imaging. FIGS. 8A, 8B illustrate an embodiment of a MRI system in accord with the present invention having a magnet configuration constructed so that the primary magnet z-axis is oriented in parallel with the patient table (head to toe direction). A preferred MRI device 50 in accord with the present invention has a primary electromagnet 60 that has two coils 61, 62 and two pole pieces 63, 64. Centered between the pole pieces of the primary electromagnet is a bias electromagnet 70 that has two coils 71, 72 and two pole pieces 73, 74. A patient table 80 is positioned for head to toe direction in parallel with the z-axis of the magnet configuration and is moveable, particularly in the z-direction, to position the desired portion of the patient in the region of homogeneity H of the background field, also known as the imaging volume or the target region. A ferromagnetic core 65 provides an internal flux path for the primary electromagnet. Vertical ferromagnetic bars 75, 76 with the central portion of core 65 provide an internal flux path for the bias electromagnet. Preferably, the pole pieces of both magnets are extended laterally beyond the width of the patient table to aid in providing a maximum remote region of background field homogeneity. Various well known shimming means such as shimming coils (not shown) can also be used to define and position the remote region of background field homogeneity.

Figure 9A:
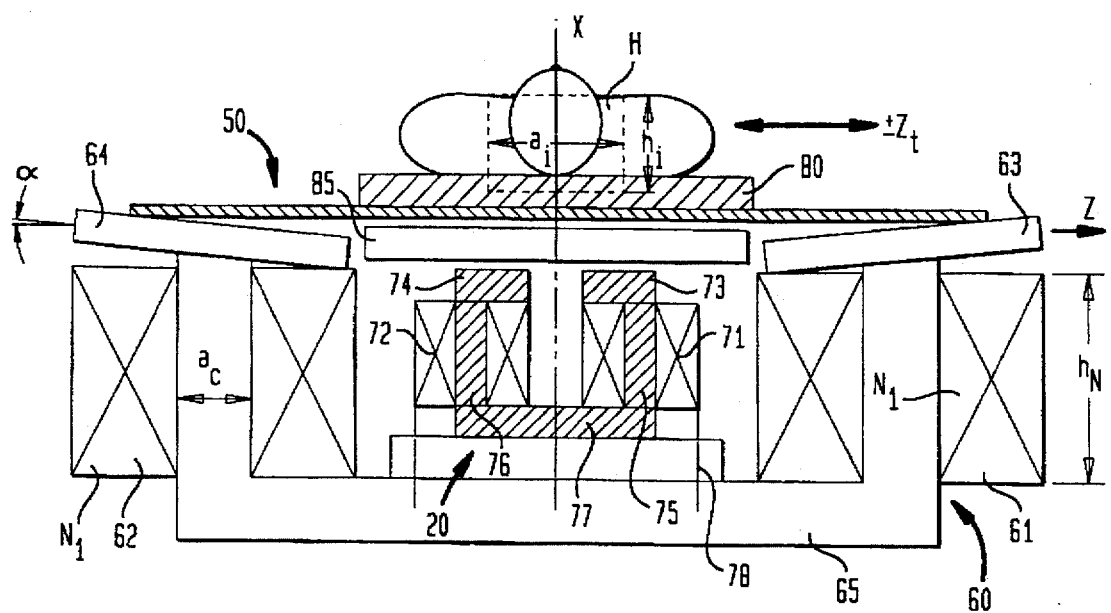
FIG. 9A is a front elevational view, partially in cross section, of an embodiment of a whole body open magnet configuration for an MRI system in accord with the present invention wherein the background magnetic field provided by the magnet is perpendicular to the long axis of a patient table.
Figure 9B:
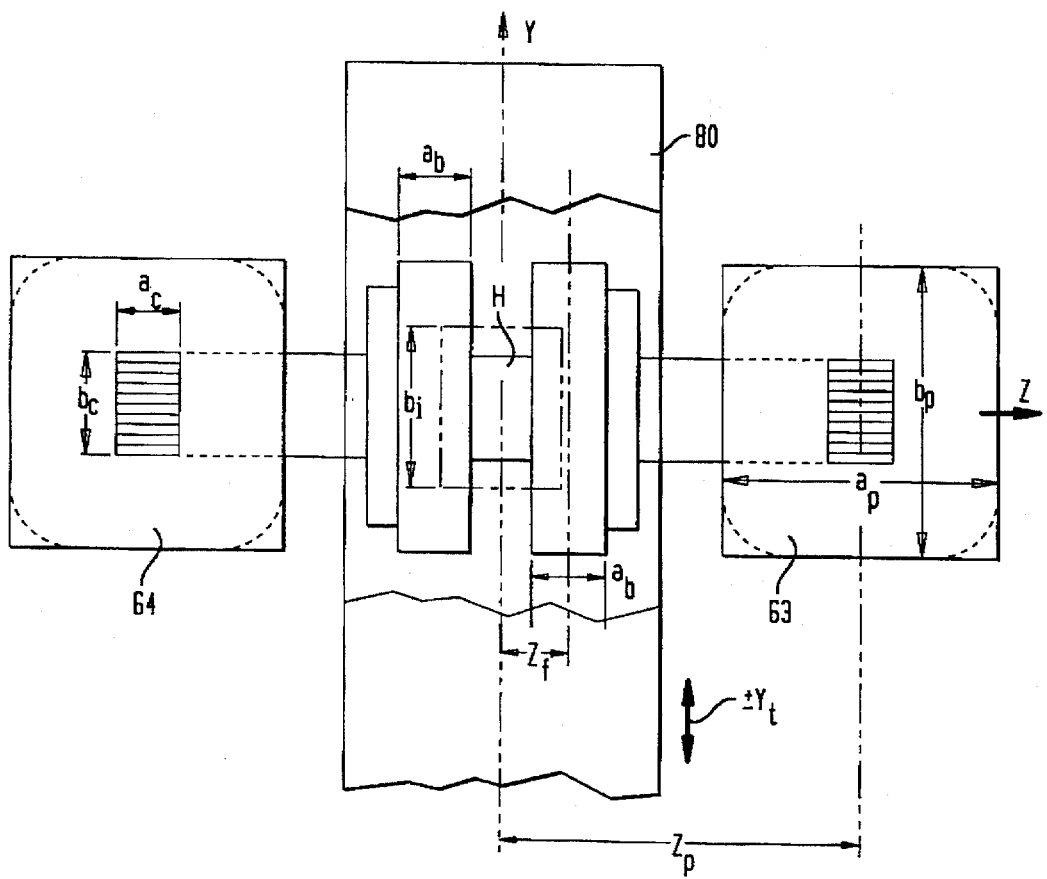
FIG. 9B is a plan view, partially in cross section, of the magnet configuration of FIG. 9A.

FIGS. 9A, 9B illustrate an MRI system in accord with the present invention having a magnet configuration constructed so that the primary magnet z-axis is oriented perpendicular to the patient table (head to toe direction). A preferred MRI device 50 in accord with the present invention has a primary electromagnet 60 that has two coils 61, 62 and two pole pieces 63, 64. Centered between the pole pieces of the primary electromagnet is a bias electromagnet 70 that has two coils 71, 72 and two pole pieces 73, 74. A patient table 80 is positioned for head to toe direction perpendicular to the z-axis of the magnet configuration and is moveable, particularly in the y-direction (i.e., perpendicular to the z-direction), to position the desired portion of the patient in the region of homogeneity H of the background field, also known as the imaging volume or the target region. A ferromagnetic core 65 provides an internal flux path for the primary electromagnet. Vertical ferromagnetic bars 75, 76 with the central portion core portion 77 provide an internal flux path for the bias electromagnet. The bias core path is separated from the primary electromagnet core 65 by a layer 78 of non-magnetic material. Preferably, the pole pieces of both magnets are extended laterally beyond the width of the patient table to aid in providing a maximum remote region of background field homogeneity. As illustrated in FIG. 9A (and in FIG. 8A), the pole pieces preferably are positioned at an acute angle $\alpha$ to the plane of the patient table. Shimming coils (not shown) can also be used to define and position the remote region of background field homogeneity H. Planar xyz gradient and rf coils are positioned below the patient table and can extend over the surface of the main pole pieces 63 and 64. The particular geometry and size of the gradient and rf coils must be optimized for each particular application, as is well known in the art.

A plot of the $B_z$ component of the remote background field showing a region of substantial homogeneity is illustrated in FIG. 10.

The invention has been described in detail with reference to preferred embodiments thereof. However, it will be appreciated that, upon consideration of the present specification and drawings, those skilled in the art may make modifications and improvements within the spirit and scope of this invention as defined by the claims. For example, superconductors can be used for the electromagnets or a permanent magnet can be used instead of an electromagnet.

I claim:

1. A magnetic resonance imaging system comprising an open magnet structure that provides a remote region of background field homogeneity for imaging, spatial encoding gradient coils and an rf coil, wherein the open magnet comprises:

a primary magnet having two primary pole pieces connected by a primary ferromagnetic core for internal flux, each primary pole piece having a surface facing away from the primary magnet, and a bias magnet having two bias pole pieces located between the two primary pole pieces and connected by a bias ferromagnetic flux pathway for internal flux, the bias magnet being structured and arranged to have polarity opposite to the primary magnet, each bias pole piece having a surface facing away from the bias magnet and in a direction the same as the surfaces of the primary pole pieces, superposition of the magnetic fields of the primary magnet and bias magnet providing a region of substantial background field homogeneity remote from the magnets in said direction.

2. A magnetic resonance imaging system in accord with claim 1, wherein said primary magnet is an electromagnet comprising two primary coils, one associated with each of the primary pole pieces, the primary ferromagnetic core linking the two coils for internal flux.

3. A magnetic resonance imaging system in accord with claim 1, wherein the bias magnet is an electromagnet comprising two bias coils, one associated with each of the bias pole pieces, the bias ferromagnetic flux pathway linking the two coils for internal flux.

4. A magnetic resonance imaging system in accord with claim 2, wherein the bias magnet is an electromagnet comprising two bias coils, one associated with each of the bias pole pieces, the bias ferromagnetic flux pathway linking the two coils for internal flux, and wherein the primary ferromagnetic core and the bias ferromagnetic flux pathway have a common portion.

5. A magnetic resonance imaging system in accord with claim 2, wherein the bias magnet is an electromagnet comprising two bias coils, one associated with each of the bias pole pieces, the bias ferromagnetic flux pathway linking the two coils for internal flux, and wherein the primary ferromagnetic core and the bias ferromagnetic flux pathway are separated by a layer of nonmagnetic material.

6. A magnetic resonance imaging system in accord with claim 1, wherein the spatial encoding gradient coils are planar coils providing a remote gradient field in the region of substantial background field homogeneity.

7. A magnetic resonance imaging system in accord with claim 1, wherein the rf coil is a planar coil providing a remote rf field in the region of substantial background field homogeneity.

8. A magnetic resonance imaging system in accord with claim 6, wherein the primary and bias pole pieces are spaced along a z-axis in a rectangular coordinate system, a y-axis extends perpendicular to the z-axis with the y, z-axes defining a plane substantially parallel to the pole pieces, and a x-axis extending in a direction perpendicular to said plane, wherein the background $B_o$ field extends in the direction of the z-axis, and wherein the spatial encoding gradient coils comprise a planar x gradient coil comprising two pair of current loops that are symmetric about the y and z axes with a first pair of current loops, one on each side of the y-axis, being external to a second pair of current loops located between the first pair of loops with one loop of the second pair on each side of the y-axis, the first pair of current loops having a polarity opposite to the second pair of current loops.

9. A magnetic resonance imaging system in accord with claim 6, wherein the primary and bias pole pieces are spaced along a z-axis in a rectangular coordinate system, a y-axis extends perpendicular to the z-axis with the y, z-axes defining a plane substantially parallel to the pole pieces, and a x-axis extending in a direction perpendicular to said plane, wherein the background $B_o$ field extends in the direction of the z-axis, and wherein the spatial encoding gradient coils comprise a planar x gradient coil comprising a plurality of current wires arranged in an array in the y, z plane perpendicular to the z-axis, the array being symmetrical about both y- and z-axes, the array comprising three sections of wires with two outer sections having opposite polarity to the inner section.

10. A magnetic resonance imaging system in accord with claim 6, wherein the primary and bias pole pieces are spaced along a z-axis in a rectangular coordinate system, a y-axis extends perpendicular to the z-axis with the y, z-axes defining a plane substantially parallel to the pole pieces, and a x-axis extending in a direction perpendicular to said plane, wherein the background $B_o$ field extends in the direction of the z-axis, and wherein the spatial encoding gradient coils comprise a planar y gradient coil comprising a plurality of current wires arranged in an array in the y, z plane perpendicular to the z-axis, the array being symmetrical about both y- and z-axes, the array comprising sections of wires arranged so that for y being negative in the section adjacent to the z-axis all of the wires carry current having a positive polarity, in the next adjacent section a fraction of the wires carry current having a negative polarity, and in each succeeding section moving away from the z-axis the fraction of wires carrying current having a negative polarity increases in a linear manner until in the last section all wires carry current having a negative polarity, and on the opposite side of the z-axis the polarity of current is reversed in the sections providing symmetry about the z-axis.

11. A magnetic resonance imaging system in accord with claim 6, wherein the primary and bias pole pieces are spaced along a z-axis in a rectangular coordinate system, a y-axis extends perpendicular to the z-axis with the y, z-axes defining a plane substantially parallel to the pole pieces, and a x-axis extending in a direction perpendicular to said plane, wherein the background $B_o$ field extends in the direction of the z-axis, and wherein the spatial encoding gradient coils comprise a planar z gradient coil comprising two current loops in the y, z plane in a symmetrical arrangement with respect both the y and z axes, a first loop arranged exterior to and surrounding a second loop and having opposite polarity to the second loop.

12. A magnetic resonance imaging system in accord with claim 7, wherein the primary and bias pole pieces are spaced along a z-axis in a rectangular coordinate system, a y-axis extends perpendicular to the z-axis with the y, z-axes defining a plane substantially parallel to the pole pieces, and a x-axis extending in a direction perpendicular to said plane, wherein the background $B_o$ field extends in the direction of the z-axis, and wherein the rf coil is a planar rf coil comprising three or more axisymmetrical coils arranged in a y, z plane.

13. A spatial encoding gradient coil for a magnetic resonance imaging system, wherein the spatial encoding gradient coil is selected from the group consisting of (i) a plurality of planar current loops or (ii) a plurality of current wire sets, which provide a remote gradient field in the region of substantial background field homogeneity, wherein a pair of current loops or a pair of current wire sets provide a primary field and an opposing current loop or an opposing current wire set provides a bias field.

14. A spatial encoding gradient coil for a magnetic resonance imaging system in accord with claim 13, wherein the system has a background $B_o$ field in a direction parallel to the z-axis in a rectangular coordinate system, a y-axis extends perpendicular to the z-axis with the y, z-axes defining a plane, and wherein the spatial encoding gradient coil is a planar x gradient coil comprising two pair of current loops that are symmetric about the y and z axes with a first pair of current loops, one on each side of the y-axis, being external to a second pair of current loops located between the first pair of loops with one loop of the second pair on each side of the y-axis, the first pair of current loops, which produce the primary field, having a polarity opposite to the second pair of current loops, which produce the bias field.

15. A spatial encoding gradient coil for a magnetic resonance imaging system in accord with claim 13, wherein the system has a background $B_o$ field in a direction parallel to the z-axis in a rectangular coordinate system, a y-axis extends perpendicular to the z-axis with the y, z-axes defining a plane, and a x-axis extending in a direction perpendicular to said plane, and wherein the spatial encoding gradient coil is a planar x gradient coil comprising a plurality of current wires arranged in an array in the y, z plane perpendicular to the z-axis, the array being symmetrical about both y- and z-axes, the array comprising three sets of wires with two outer sets having opposite polarity to the inner set.

16. A spatial encoding gradient coil for a magnetic resonance imaging system in accord with claim 13, wherein the system has a background $B_o$ field in a direction parallel to the z-axis in a rectangular coordinate system, a y-axis extends perpendicular to the z-axis with the y, z-axes defining a plane substantially parallel to the pole pieces, and a x-axis extending in a direction perpendicular to said plane, and wherein the spatial encoding gradient coil is a planar y gradient coil comprising a plurality of current wires arranged in an array in the y, z plane perpendicular to the z-axis, the array being symmetrical about both y- and z-axes, the array comprising sections of wires arranged so that for y being negative in the section adjacent to the z-axis all of the wires carry current having a positive polarity, in the next adjacent section a fraction of the wires carry current having a negative polarity, and in each succeeding section moving away from the z-axis the fraction of wires carrying current having a negative polarity increases in a linear manner until in the last section all wires carry current having a negative polarity, and on the opposite side of the z-axis the polarity of current is reversed in the sections providing symmetry about the z-axis.

17. A spatial encoding gradient coil for a magnetic resonance imaging system in accord with claim 13, wherein the system has a background B field in a direction parallel to the z-axis in a rectangular coordinate system, a y-axis extends perpendicular to the z-axis with the y, z-axes defining a plane substantially parallel to the pole pieces, and a x-axis extending in a direction perpendicular to said plane, and wherein the spatial encoding gradient coil is a planar z gradient coil comprising two current loops in the y, z plane in a symmetrical arrangement with respect both the y and z axes, a first loop arranged exterior to and surrounding a second loop and having opposite polarity to the second loop.

18. A magnetic resonance imaging system comprising an open magnet structure that provides a remote region of background field homogeneity for imaging, spatial encoding gradient coils and an rf coil, wherein the open magnet comprises:

a primary magnet having two primary pole pieces connected by a primary ferromagnetic core for internal return flux, each primary pole piece having a surface facing away from the primary magnet, and a bias magnet having two bias pole pieces located between the two primary pole pieces and connected by a bias ferromagnetic flux pathway for internal return flux, each bias pole piece having a surface facing away from the bias magnet and in a direction the same as the surfaces of the primary pole pieces, superposition of the magnetic fields of the primary magnet and bias magnet providing a region of substantial background field homogeneity remote from the magnets.

* * * * *